(12) United States Patent
Christo et al.

(10) Patent No.: US 7,849,427 B2
(45) Date of Patent: Dec. 7, 2010

(54) AUTO-ROUTER PERFORMING SIMULTANEOUS PLACEMENT OF SIGNAL AND RETURN PATHS

(75) Inventors: Michael A. Christo, Round Rock, TX (US); Julio A. Maldonado, Austin, TX (US); Roger D. Weekly, Austin, TX (US); Tingdong Zhang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 12/021,363

(22) Filed: Jan. 29, 2008

(65) Prior Publication Data

US 2009/0193383 A1 Jul. 30, 2009

(51) Int. Cl.
*G06F 17/50* (2006.01)
(52) U.S. Cl. ............................ 716/5; 716/13; 716/14; 716/15
(58) Field of Classification Search .................. 716/5, 716/13, 14, 15
See application file for complete search history.

(56) References Cited

U.S. PATENT DOCUMENTS

| | | | |
|---|---|---|---|
| 6,353,917 B1 * | 3/2002 | Muddu et al. ............. | 716/6 |
| 6,581,195 B2 | 6/2003 | Tanaka | |
| 6,769,102 B2 | 7/2004 | Frank et al. | |
| 6,922,822 B2 | 7/2005 | Frank et al. | |
| 6,993,739 B2 | 1/2006 | Becker et al. | |
| 7,017,128 B2 | 3/2006 | Audet et al. | |
| 7,240,309 B2 | 7/2007 | Saito et al. | |
| 7,272,809 B2 | 9/2007 | Becker et al. | |
| 7,739,624 B2 * | 6/2010 | McElvain et al. .......... | 716/1 |
| 2002/0084107 A1 | 7/2002 | Chang et al. | |
| 2004/0107411 A1 * | 6/2004 | Saxena et al. ............. | 716/13 |
| 2008/0067665 A1 | 3/2008 | Aziz et al. | |
| 2008/0290474 A1 * | 11/2008 | Chun et al. ............... | 257/664 |
| 2009/0031270 A1 * | 1/2009 | Douriet et al. ............ | 716/10 |
| 2009/0193380 A1 * | 7/2009 | McElvain et al. .......... | 716/12 |

OTHER PUBLICATIONS

U.S. Appl. No. 11/751,786, filed May 22, 2007, Chun, et al.
U.S. Appl. No. 11/829,179, filed Jul. 27, 2007, Douriet, et al.
Hubing, et al., "Identifying and Quantifying Print Circuit Board Inductance", Aug. 1994, IEEE International Symposium on Electromagnetic Compatibility, Symposium Record, pp. 205-208.

(Continued)

*Primary Examiner*—Phallaka Kik
(74) *Attorney, Agent, or Firm*—Mitch Harris, Atty at Law, LLC; Andrew M. Harris; Matthew W. Baca

(57) ABSTRACT

An auto routing method and system provides optimized circuit routing while maintaining proper reference return paths for critical signals. Critical signal paths are auto-routed simultaneously with corresponding reference return paths, and the reference return paths can be merged into reference planes if they are adjacent to regions connected to the same reference net. The reference return paths may be in a plane adjacent to the signal path plane in the same channel, or the reference returns may be routed in adjacent channels in the same plane as the signal path. A check may be performed on endpoints of each critical signal path to determine whether a reference return via is present within a proximity tolerance of the signal path endpoints, and a reference return via placed if not.

20 Claims, 4 Drawing Sheets

OTHER PUBLICATIONS

Chen, et al., "Via and Return Path Discontinuity Impact to High Speed Digital Signal Quality", Oct. 2000, IEEE Conference on Electrical Performance of Electronic Packaging, Digest, pp. 215-218.

Pak, et al. "Prediction and Verification of Power/Ground Plane Edge Radiation Excited by Through-Hole Signal Via Based on Balanced TLM and Via Coupling Model", Oct. 2003 IEEE Conference on Electrical Performance of Electronic Packaging, pp. 181-184.

Brokaw, et al. ,"Grounding for Low- and High-Frequency Circuits", Analog Devices Application Note AN-345, Norwood MA, Mar. 23, 1989.

* cited by examiner

AUTO-ROUTER PERFORMING SIMULTANEOUS PLACEMENT OF SIGNAL AND RETURN PATHS

BACKGROUND OF THE INVENTION

1. Technical Field

The present invention relates generally to circuit design software, and more particularly, to a methodology and computer program that simultaneously routes signal and return paths to avoid referencing signals to non-optimal reference planes.

2. Description of the Related Art

As signal frequencies increase, and with a focus on reduced power and emissions, signal management within circuit boards, multi-chip module (MCMs) substrates and other package substrates has become increasingly critical. With the high frequencies and/or narrow pulse widths of critical signals in present-day digital circuits, special layout techniques are typically required for routing critical signal paths to minimize reflections, impedance mismatches and coupling between signal paths, according to electromagnetic analysis techniques. Signal return paths, which maybe reference planes such as power planes or dedicated signal planes are typically provided between signal layers to provide controlled signal path impedance and to shield overlapping signal paths from each other.

However, not all signals routed on a given layer should be referenced to a single signal reference plane. Additionally, due to cost, thickness and fabrication limitations, it is desirable to reduce the number of power planes and/or dedicated return path planes required in an interconnect system. Typically, designs may be compromised by having to route signals through reference planes, which can split the reference planes so that they do not properly reference signals that have been or will be routed over them. Also, auto-routers typically do not solve the problem of routing specific signal return paths, and only typically route signal paths over and/or between pre-designated power planes or power plane regions.

It is therefore desirable to provide a design methodology and computer program that maintain proper reference returns for critical signal paths. It is also desirable to provide such a design methodology and computer program that optimize placement of signal paths and signal return paths during routing of an interconnect structure. It is further desirable to provide such a design methodology and computer program that auto-route signal paths while maintaining a proper reference returns for critical signal paths.

BRIEF SUMMARY OF THE INVENTION

The objective of maintaining proper signal return paths, optimizing the signal paths and signal return paths and provide for auto-routing signal paths while maintaining proper reference returns for critical signal paths is provided in a method, system and computer program product. The system is a workstation computer having program instructions in memory for carrying out the method and the computer program product is a computer-readable storage medium encoding program instructions for carrying out the method.

The method auto-routes critical signal paths and corresponding reference return paths simultaneously. The acceptance criteria for accepting a route of the critical signal path includes a routed return path corresponding to the critical signal path within a placement tolerance. The auto-router operates until all critical signal paths have been placed along with corresponding return paths. Non-critical signal paths may be routed without return paths. The signal paths and the corresponding return paths can be routed in adjacent channels in the same layer, or in the same channel in adjacent layers.

The auto-routing algorithm can also determine whether or not a return path via is present at each end of the signal path within a proximity limit, and place a return path via within the proximity limit if a via was not already present. The auto-routing algorithm may also merge regions having the same reference net as an adjacent return path, so that contiguous reference plane areas can be built-up.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS IF THE DRAWING

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying Figures, wherein like reference numerals indicate like components, and:

DETAILED DESCRIPTION OF THE INVENTION

The present invention concerns design methods and software for designing interconnect structures, such as printed circuit boards, multi-chip module (MCM) interconnects and integrated circuit package substrates, and other interconnecting silicon interposers and any other structures relying on conductive signal paths to provide interconnects for critical signals. The methods and software provide proper signal impedance by signal referencing, while providing for flexible routing of interconnect signal paths. An auto-routing algorithm routes the signal return path at the same time the signal path is routed, ensuring proper signal return. After all critical signal paths have been routed, signal returns connected to the same net can be merged to provide more contiguous reference planes. A preference for routing signal paths having the same return net adjacent to each other can be included within the auto-routing algorithm so that reference plane areas generated from merged reference returns are preferentially larger than they would be for random placement. The routing algorithm also determines whether reference return vias are present in a proximity limit around signal path endpoints. Additional return vias are placed near signal path endpoints if not already present within the proximity limit.

Figure 1A:
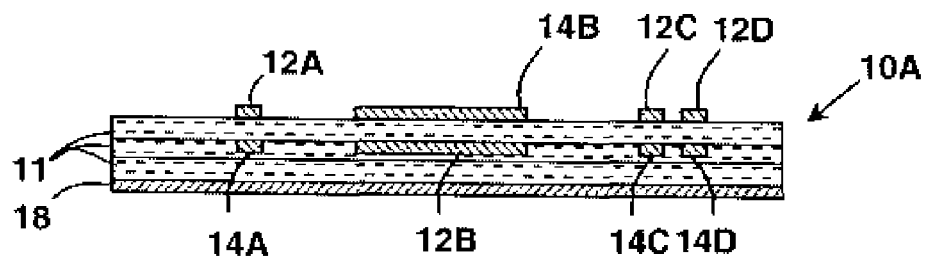
FIGS. 1A and 1B are cross-sectional views and FIG. 1C is a top view of an interconnect structure as auto-routed by a method in accordance with an embodiment of the present invention.

Referring now to FIG. 1A, a cross-section of an interconnect structure model 10A is shown, during auto-routing in accordance with an embodiment of the present invention. In the depicted embodiment, conductive signal paths 12A and 12C-12D are routed in a layer adjacent to another layer containing corresponding reference return paths 14A and 14C-14D. Reference return path 14B is shown as routed on the layer containing conductive signal paths 12A and 12C-12D and signal path 12B is routed on the other signal layer, for generality. If reference return path 14B is connected to a different reference plane than reference return paths 14C-14D, such an arrangement can also lead to better "fill" of the corresponding reference planes once all of the routed reference return paths are merged. Signal paths 12A-12D are routed in the same routing channel (or "track") as reference return paths 14A-14D, i.e, directly above/below signal paths 12A-12D, but depending on manufacturing requirements and tolerances, a slight lateral displacement may be present between the conductive signal paths 12A-12D and reference return paths 14A-14D. Further, due to routing requirements and termination at the endpoints of signal paths 12A-12D and reference return paths 14A-14D, the layout of signal paths 12A-12D and reference return paths 14A-14D, will not be identical near the endpoints. Finally, due to limited routing resources, differences between the layout of signal paths 12A-12D and reference return paths 14A-14D may be introduced in the routed paths, although it is a goal of the methodology of the present invention to minimize such disruption. For illustrative purposes, only two layers of signal/reference return paths are shown and a single reference return plane 18 are shown, along with insulating dielectric layers 11 interposed between the conductor layers. However, it is understood that a typical interconnect structure may have a large number of interconnect signal and reference plane layers, as well as a much larger number of interconnecting signal paths than are illustrated.

In the methodology of the present invention, which is a computer-performed auto-routing method, allocation of area for placement of conductors for signal paths 12A-12D is performed in conjunction with allocation of area for placement of conductors for reference return paths 14A-14D, effectively at the same time. While existing auto-routers place signal paths, and sometimes verify that critical signal paths are routed over reference planes, the methods of the present invention insures that suitable reference return paths are present for each critical signal. The reference return paths may be subsequently merged if they are adjacent to other reference return paths connected to the same net, i.e., no metal connected to other nets lies in-between the reference return paths that are merged. In general, if multiple planes of signal paths are referenced to the same voltage and disposed on either side of a plane in which the reference return paths are routed, larger areas of reference return paths can be merged. For example, when a first signal path layer having signal paths oriented in a first direction is disposed on one side of a reference return path plane and a second signal path layer having signal paths oriented in a second direction is disposed on the other side of the reference return path plane, then the routed reference return paths form a cross-hatch pattern that can be filled completely with metal area.

Figure 1B:
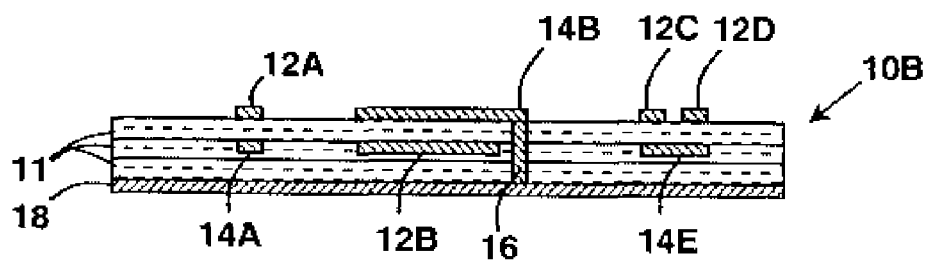

Referring now to FIG. 1B, a cross-section of the interconnect structure model 10A of FIG. 1A is shown after the steps of return via placement and reference return path merging to form interconnect structure model 10B. Placement of a signal return via 16 from reference return path 14B to reference plane 18 is made due to detection that a reference return via was not present within a specified radius of an endpoint of reference return path 14B. Reference return region/merged path 14E illustrates merging of reference return paths 14C and 14D of FIG. 1A.

Figure 1C:
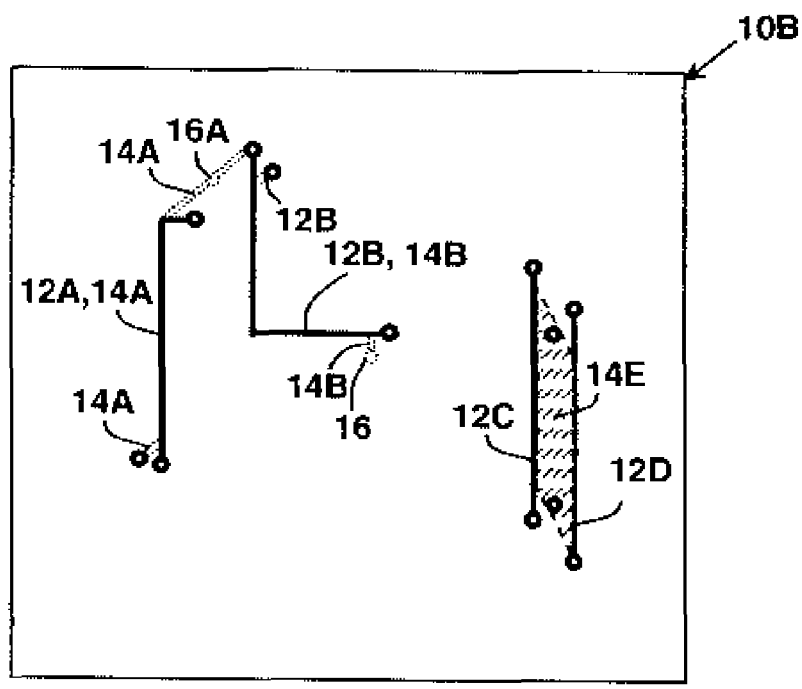

Referring now to FIG. 1C, a top view of the interconnect structure model 10B of FIG. 1B is shown. As illustrated, endpoints of signal paths 12A and 12B, which overlap in the view reference return paths 14A and 14B with the exception of endpoint stubs and vias. One endpoint of reference return path 14A is shown routed to a via connecting to an endpoint of reference return path 14A on another layer, with an additional via 16A placed to connect both return paths to reference plane 18 (not shown). Merged reference return region 14E is shown connected to reference plane 18 by the placement of two additional vias near the endpoints of signal paths 12C and 12D.

Figure 2A:
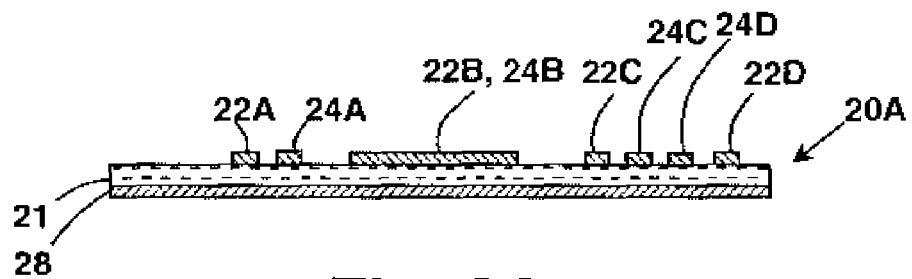
FIGS. 2A and 2B are cross-sectional views and FIG. 2C is a top view of an interconnect structure as auto-routed by a method in accordance with an embodiment of the present invention.

Referring now to FIG. 2A, a cross-section of an interconnect structure model 20A is shown, during auto-routing in accordance with another embodiment of the present invention. The depicted embodiment is similar to that illustrated in FIG. 1A, so only differences between them will be described below. In the model of FIG. 2A, signal paths 22A-22D are routed in the same layer as reference return paths 24A-24D in adjacent channels/tracks. A reference plane 28 is shown, along with insulating dielectric layer 21.

Figure 2B:
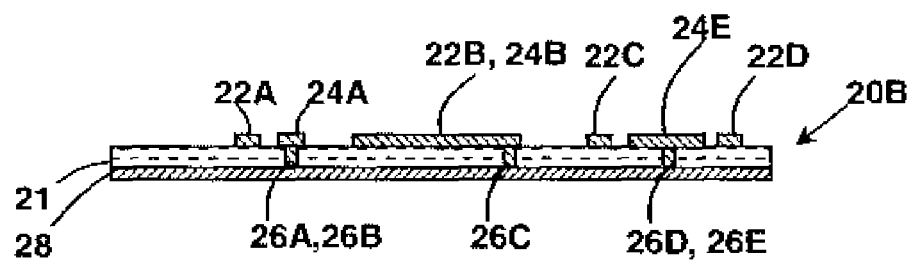

Referring now to FIG. 2B, a cross-section of the interconnect structure model 20A of FIG. 2A is shown after the steps of return via placement and reference return path merging to form interconnect structure model 20B. Reference return region/merged path 24E illustrates merging of reference return paths 24C and 24D of FIG. 2A. Preference can be given to place reference return paths corresponding to two different signal paths in adjacent channels, so that the reference return paths can be merged. As an alternative, a single reference return path can be routed for a first signal path and at least a portion of that reference return path "adopted" as a return path for another signal path routed on the opposite side of the reference return path, so that no additional reference return path is routed under that particular condition, reducing the width/number of channels required for the reference return path. FIG. 2B also shows placement of signal return vias 26A-26C from reference return paths 24A-24C, which are provided at endpoints of each of reference return paths 24A-24C, and placement of vias 26D-26E, which connect to the merged reference return path region 24E replacing reference return paths 24C and 24D of FIG. 2A.

Figure 2C:
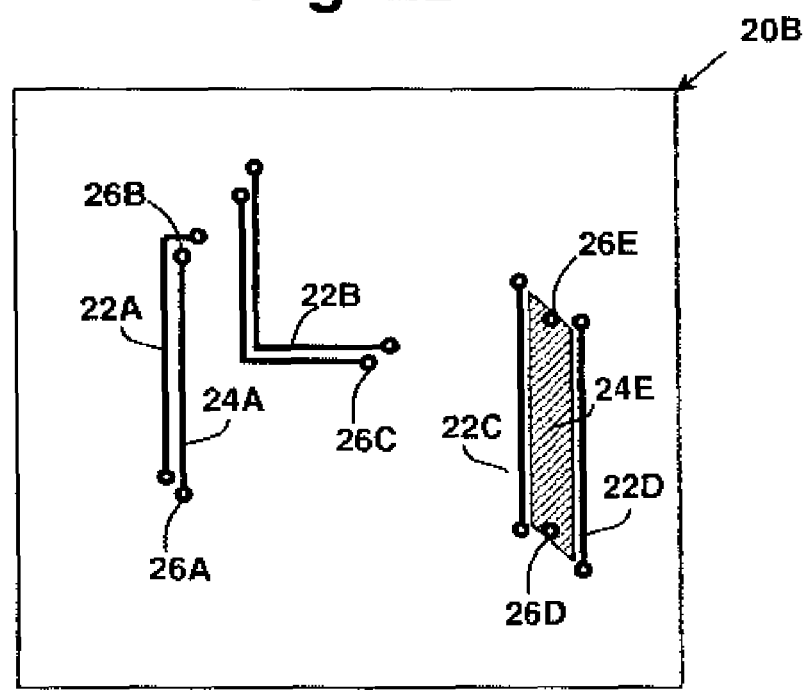

Referring now to FIG. 2C, a top view of the interconnect structure model 20B of FIG. 2B is shown. As illustrated, since reference return paths endpoints of signal paths 22A and 22B do not overlap reference return paths 24A-24B as in the interconnect structure models of FIGS. 1A-1C do, no stubs are required at the endpoints and vias are provided at each endpoint, which for the reference return paths, can be made to the reference plane as illustrated by vias 26A-26E.

Figure 3:
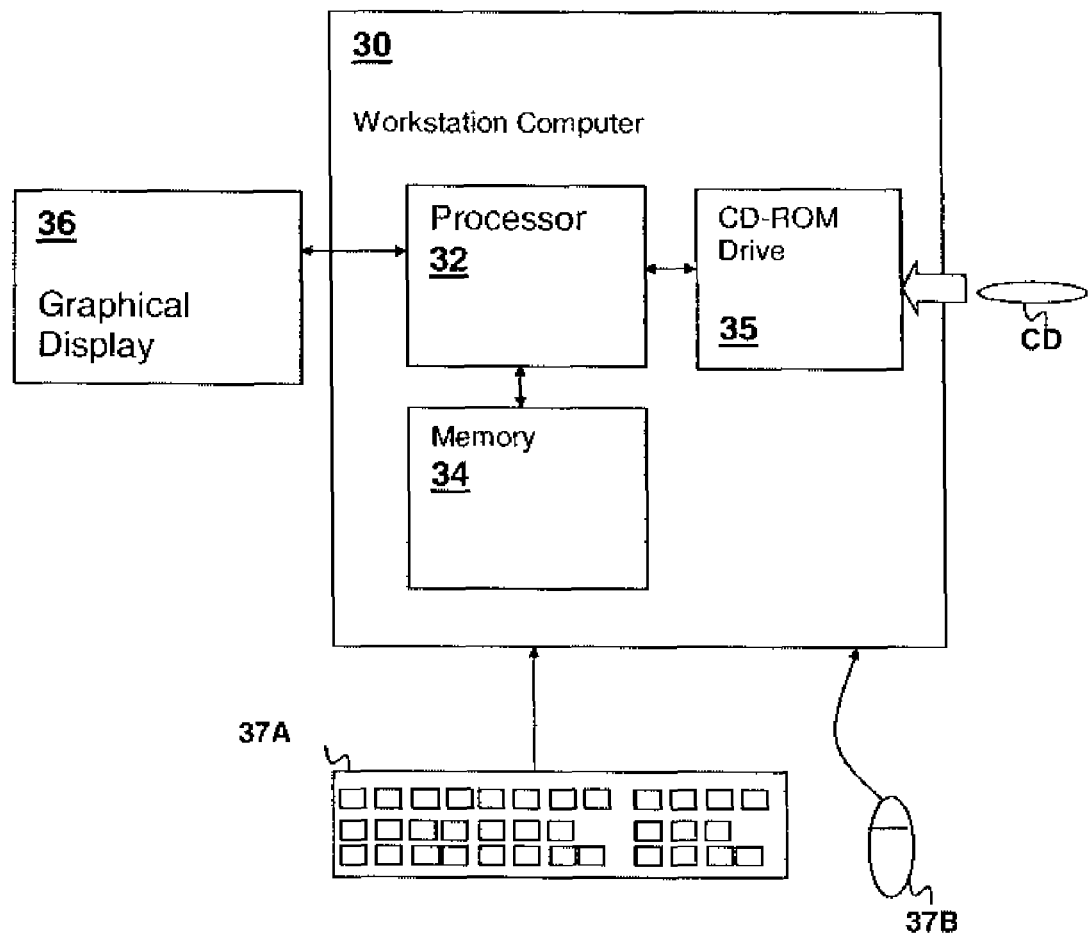
FIG. 3 is a pictorial diagram depicting a workstation computer system by which design methods and computer program products are executed in accordance with an embodiment of the present invention.

Referring now to FIG. 3, a workstation computer system 30 is shown in which the methods of the present invention are carried out in accordance with an embodiment of the present invention, according to program instructions that may be embodied in a computer program product in accordance with a present invention, for example program instructions stored on a CD-ROM disc CD. Workstation computer system includes a processor 32 for executing the program instructions coupled to a memory 34 for storing the program instructions, data and results used in designing interconnect structures in accordance with embodiments of the present invention. Workstation computer system 30 also includes peripheral devices such as CD-ROM drive 35 for reading discs such as CD in order to load the program instructions into workstation computer 30. Input devices, such as a keyboard 37A and a mouse 37B are coupled to workstation computer system 30 for receiving user input. A graphical display 36 is provided for displaying results such as the layout of interconnect structure layers and simulations of their performance. The depicted workstation computer system 30 is only exemplary and illustrates one type of computer system and arrangement suitable for carrying out the design methods of the present invention. The design methods generally auto-route signal paths along with reference return paths, places vias as described above, and optionally merges return path regions free of other nets. Workstation computer 30 also computes and displays output values indicating routing limitations and violations of design tolerances.

Figure 4:
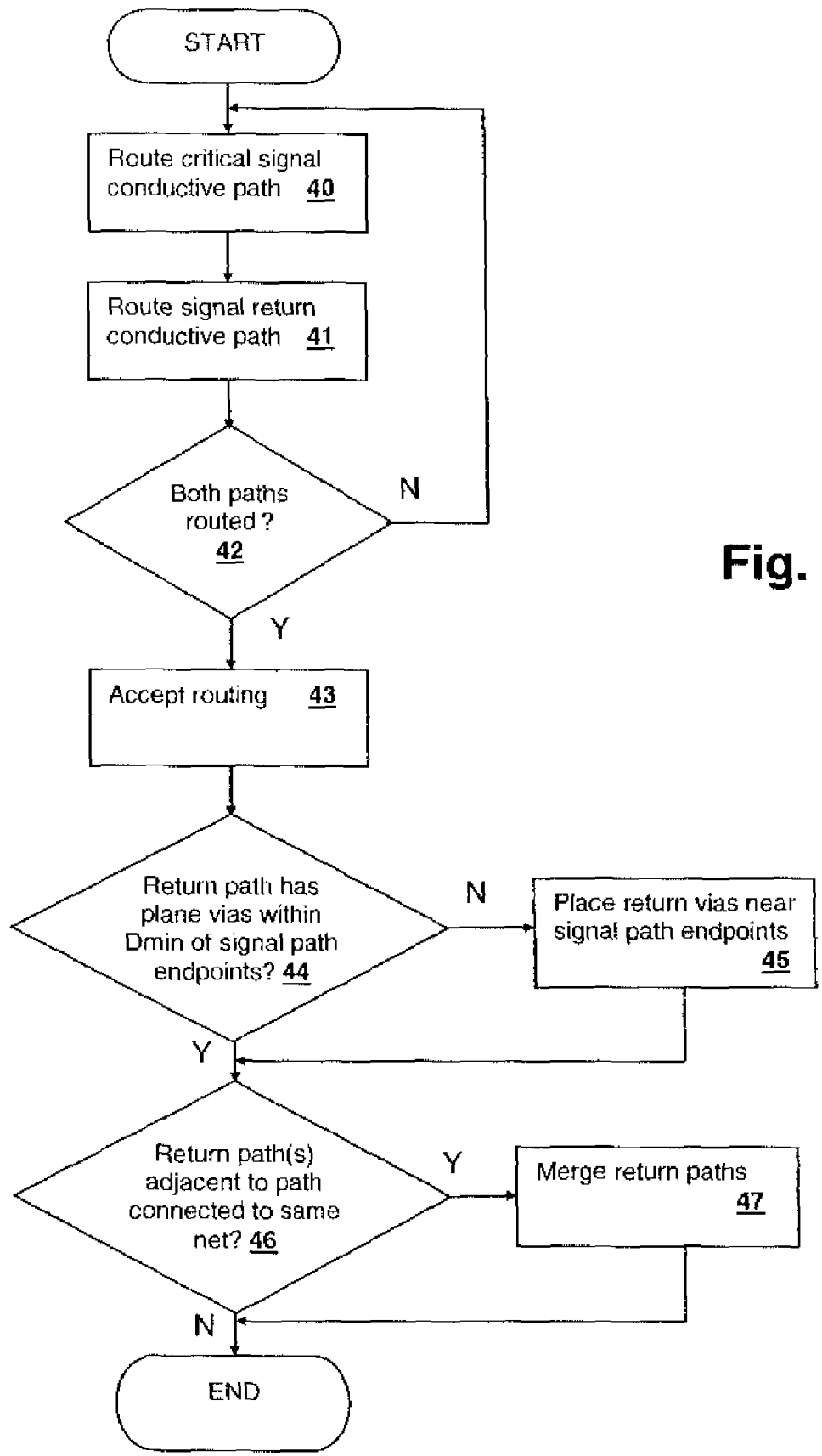
FIG. 4 is a flowchart illustrating a method in accordance with an embodiment of the present invention.

Referring now to FIG. 4, a method in accordance with an embodiment of the invention is depicted in a flowchart. First, a critical signal path conductor is routed (step 40) and a suitable reference return path is routed in an adjacent layer or channel (step 41). If both paths are acceptably routed (decision 42), then the routing is accepted/stored and the channels/tracks are removed from the available routing resources (step 43), otherwise another routing is tried, repeating steps 40-42 until the signal path and reference return path are acceptably routed. Next, the reference return path is checked for reference plane connection vias within a minimum distance Dm in from the endpoints of the signal path (decision 44), and if a via is not sufficiently close, one is placed (step 45). Next, reference return paths adjacent to the routed reference return path are checked to see if they are connected to the same net (decision 46), and if so, the reference return paths are merged 47 to generate a larger reference plane area.

While the invention has been particularly shown and described with reference to the preferred embodiment thereof, it will be understood by those skilled in the art that the foregoing and other changes in form, and details may be made therein without departing from the spirit and scope of the invention.

What is claimed is;

1. A computer-performed method of designing an electrical circuit interconnect structure, comprising:
   in a computer model of an interconnect structure design, routing, using a computer, a first conductive path for a critical signal using auto-routing algorithm;
   prior to accepting the first conductive signal path as a routed path according to an auto-routing path acceptance criteria, routing a second conductive path for a reference return corresponding to the critical signal proximate the first conductive path, wherein the auto-routing path acceptance criteria requires meeting criteria for placement of both the signal path and the reference return path;
   responsive to meeting the auto-routing path acceptance criteria for both of the first conductive path and the second conductive path, accepting the first conductive path and the second conductive path as a routed pair for the critical signal and the corresponding reference return;
   responsive to not meeting the auto-routing path acceptance criteria for either of the first conductive path or the second conductive path, repeating the routing of the first conductive signal path using another routing and repeating the routing of the second conductive signal path; and
   repeating the routing a first conductive path, routing a second conductive path and accepting for other critical signals.

2. The computer-performed method of claim 1, wherein the routing a first conductive path and the routing a second conductive path route the first conducive path and the second conductive path in parallel channels of the same layer of the interconnect structure.

3. The computer-performed method of claim 1, wherein the routing a first conductive path and the routing a second conductive path route the first conducive path and the second conductive path in substantially identical channels of adjacent layers of the interconnect structure.

4. The computer-performed method of claim 1, further comprising checking the second conductive path for return vias proximate endpoints of the first conductive path, and wherein in response to the checking determining that a return via is not within an allowable distance from an endpoint of the first conductive path, placing a return via within the allowable distance.

5. The computer-performed method of claim 1, further comprising determining whether or not the second conductive path is adjacent to another conductive region connected to a plane connected to the same net as the reference return, and if the second conductive path is adjacent to another conductive region connected to a plane corresponding to the reference return, merging the second conductive path with the another conductive region.

6. The computer performed method of claim 5, wherein the auto-routing algorithm uses a criterion for causing the second conductive path to be preferably placed adjacent to other reference paths having the same net, whereby contiguous reference planes are preferred.

7. The computer-performed method of claim 6, further comprising checking the second conductive path for return vias proximate endpoints of the first conductive path, and wherein in response to the checking determining that a return via is not within an allowable distance from an endpoint of the first conductive path, placing a return via within the allowable distance.

8. A computer program product comprising a non-transitory computer-readable storage media containing program instructions for execution by a processor for designing an electrical circuit interconnect structure, the program instructions comprising program instructions for:
   in a computer model of an interconnect structure design, routing a first conductive path for a critical signal using auto-routing algorithm;
   prior to accepting the first conductive signal path as a routed path according to an auto-routing path acceptance criteria, routing a second conductive path for a reference return corresponding to the critical signal proximate the first conductive path, wherein the auto-routing path acceptance criteria requires meeting criteria for placement of both the signal path and the reference return path;
   responsive to meeting the auto-routing path acceptance criteria for both of the first conductive path and the second conductive path, accepting the first conductive path and the second conductive path as a routed pair for the critical signal and the corresponding reference return;
   responsive to not meeting the auto-routing path acceptance criteria for either of the first conductive path or the second conductive path, repeating the routing of the first conductive signal path using another routing and repeating the routing of the second conductive signal path; and
   repeating the routing a first conductive path, routing a second conductive path and accepting for other critical signals.

9. The computer program product of claim 8, wherein the program instructions for routing a first conductive path and the program instructions for routing a second conductive path route the first conducive path and the second conductive path in parallel channels of the same layer of the interconnect structure.

10. The computer program product of claim 8, wherein the program instructions for routing a first conductive path and the program instructions for routing a second conductive path route the first conducive path and the second conductive path in substantially identical channels of adjacent layers of the interconnect structure.

11. The computer program product of claim 8, further comprising program instructions for checking the second conductive path for return vias proximate endpoints of the first conductive path, and wherein in response to the checking determining that a return via is not within an allowable distance from an endpoint of the first conductive path, placing a return via within the allowable distance.

12. The computer program product of claim 8, further comprising program instructions for determining whether or not the second conductive path is adjacent to another conductive region connected to a plane connected to the same net as the reference return, and if the second conductive path is adjacent to another conductive region connected to a plane corresponding to the reference return, merging the second conductive path with the another conductive region.

13. The computer program product of claim 12, wherein the auto-routing algorithm uses a criterion for causing the second conductive path to be preferably placed adjacent to other reference paths having the same net, whereby contiguous reference planes are preferred.

14. The computer program product of claim 13, further comprising program instructions for checking the second conductive path for return vias proximate endpoints of the first conductive path, and wherein in response to the checking determining that a return via is not within an allowable distance from an endpoint of the first conductive path, placing a return via within the allowable distance.

15. A workstation computer system, comprising a processor for executing program instructions and a memory for storing the program instructions and data, wherein the program instructions include program instructions for designing an electrical circuit interconnect structure, the program instructions comprising program instructions for:
in a computer model of an interconnect structure design, routing a first conductive path for a critical signal using auto-routing algorithm;
prior to accepting the first conductive signal path as a routed path according to an auto-routing path acceptance criteria, routing a second conductive path for a reference return corresponding to the critical signal proximate the first conductive path, wherein the auto-routing path acceptance criteria requires meeting criteria for placement of both the signal path and the reference return path;
responsive to meeting the auto-routing path acceptance criteria for both of the first conductive path and the second conductive path, accepting the first conductive path and the second conductive path as a routed pair for the critical signal and the corresponding reference return;
responsive to not meeting the auto-routing path acceptance criteria for either of the first conductive path or the second conductive path, repeating the routing of the first conductive signal path using another routing and repeating the routing of the second conductive signal path; and
repeating the routing a first conductive path, routing a second conductive path and accepting for other critical signals.

16. The workstation computer system of claim 15, wherein the program instructions for routing a first conductive path and the program instructions for routing a second conductive path route the first conducive path and the second conductive path in parallel channels of the same layer of the interconnect structure.

17. The workstation computer system of claim 15, wherein the program instructions for routing a first conductive path and the program instructions for routing a second conductive path route the first conducive path and the second conductive path in substantially identical channels of adjacent layers of the interconnect structure.

18. The workstation computer system of claim 15, further comprising program instructions for checking the second conductive path for return vias proximate endpoints of the first conductive path, and wherein in response to the checking determining that a return via is not within an allowable distance from an endpoint of the first conductive path, placing a return via within the allowable distance.

19. The workstation computer system of claim 15, further comprising program instructions for determining whether or not the second conductive path is adjacent to another conductive region connected to a plane connected to the same net as the reference return, and if the second conductive path is adjacent to another conductive region connected to a plane corresponding to the reference return, merging the second conductive path with the another conductive region.

20. The workstation computer system of claim 19, wherein the auto-routing algorithm uses a criterion for causing the second conductive path to be preferably placed adjacent to other reference paths having the same net, whereby contiguous reference planes are preferred.

* * * * *